(12) United States Patent
Mansfield

(10) Patent No.: US 6,441,616 B1
(45) Date of Patent: Aug. 27, 2002

(54) ACTIVE CONTROL OF SOUND GENERATION IN MRI GRADIENT COIL STRUCTURES

(76) Inventor: Paul Mansfield, 68 Beeston Fields Drive, Bramcote, Nottingham NG9 3DD (GB)

(*) Notice: Subject to any disclaimer, the term of this patent is extended or adjusted under 35 U.S.C. 154(b) by 0 days.

(21) Appl. No.: 09/623,923
(22) PCT Filed: Mar. 8, 1999
(86) PCT No.: PCT/GB99/00692
§ 371 (c)(1), (2), (4) Date: Nov. 13, 2000
(87) PCT Pub. No.: WO99/45407
PCT Pub. Date: Sep. 10, 1999

(30) Foreign Application Priority Data

Mar. 7, 1998 (GB) .......................... 9804829

(51) Int. Cl.$^7$ ................................. G01V 3/00
(52) U.S. Cl. ......................... 324/318; 324/319
(58) Field of Search .................. 324/318, 319, 324/320, 322, 300, 306, 307, 309

(56) References Cited

U.S. PATENT DOCUMENTS

| | | | |
|---|---|---|---|
| 5,256,969 A | 10/1993 | Miyajima | 324/318 |
| 5,331,281 A | 7/1994 | Otsuka | 324/318 |
| 5,332,972 A | 7/1994 | Takenouchi | 324/318 |
| 5,886,548 A | * 3/1999 | Doty et al. | 324/318 |
| 6,107,799 A | * 8/2000 | Sellers et al. | 324/318 |

FOREIGN PATENT DOCUMENTS

WO    WO 96 37185    10/1996

OTHER PUBLICATIONS

Mansfield, P. et al, "Sound Generation In Gradient Coil Structures for MRI", *Magnetic Resonance In Medicine*, vol. 39, No. 4, pp. 539–550, Apr. 1, 1998.

* cited by examiner

Primary Examiner—Louis Arana
(74) Attorney, Agent, or Firm—Kilpatrick Stockton, LLP

(57) ABSTRACT

An acoustically quiet gradient coil structure for a magnetic resonance imaging system, said coil structure comprising one or more conductors embedded in a plate of acoustically transmitting material, said plate having one or more edge surfaces characterized in that at least one edge surface (100, 102, 104, 106) of said plate is chamfered. The plate may comprise a composite cellular structure of cellular materials having positive and negative Poisson's ratio σ such that the overall σ is substantially zero.

38 Claims, 15 Drawing Sheets

(a)

(b)

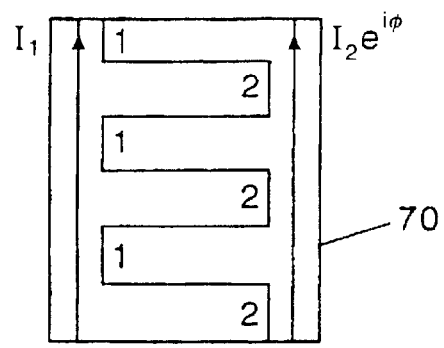
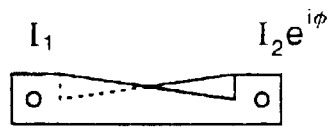
Fig 7
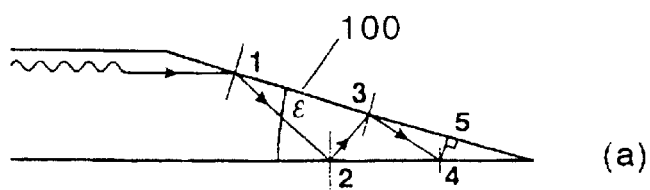
(a)
Fig 10
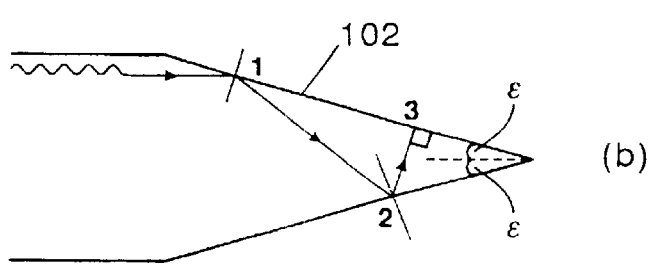
(b)
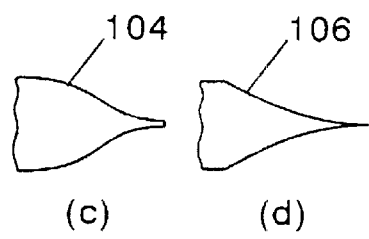
(c)    (d)

(a)

(b)

(a)

(b)

(a)

(b)

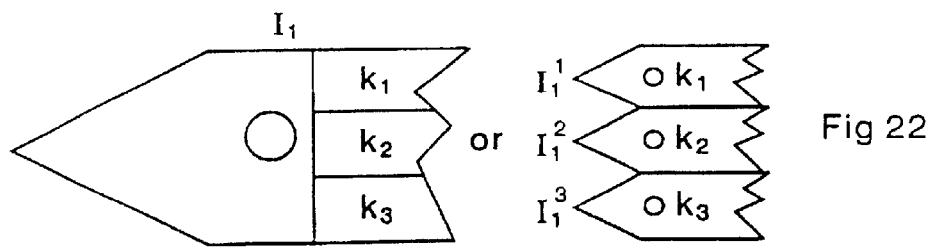
Fig 22
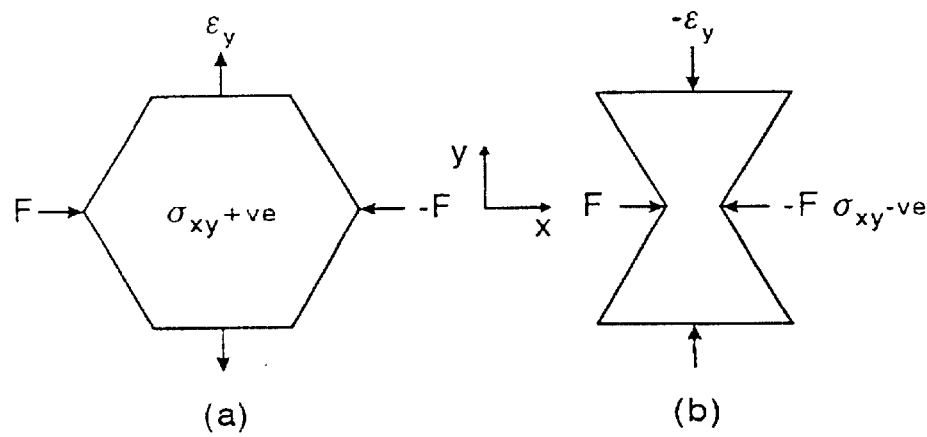
(a)  (b)
Fig 23
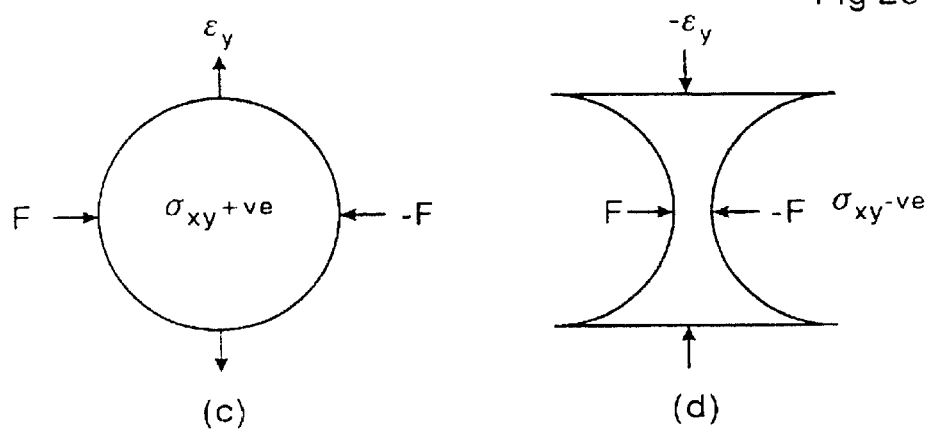
(c)  (d)

ACTIVE CONTROL OF SOUND GENERATION IN MRI GRADIENT COIL STRUCTURES

The present invention relates to acoustically quiet gradient coil designs, particularly for use in magnetic resonance imaging (MRI).

In modern MRI scanners there is a trend for higher gradient strength and faster switching times in order to scan patients more quickly. The combination of high gradient strength and fast switching time means that the Lorentz forces which accompany the currents when switched in the presence of a high static magnetic field are very large and create correspondingly large amounts of vibration in the gradient coil structure which, in turn, generate potentially dangerous acoustic noise levels. Our first approach to ameliorate the noise problem was based on Lorentz force balancing. (Active acoustic screening: design principles for quiet gradient coils in MRI. P Mansfield, P Glover and R Bowtell, Meas Sci Technol 5, 1021–1025 (1994). Active acoustic screening: reduction of noise in gradient coils by Lorentz force balancing. P Mansfield, B L W Chapman, R Bowtell, P Glover, R Coxon and P R harvey, Mag Res Med 33, 276–281 (1995). Quiet gradient coils: active acoustically and magnetically screened distributed transverse gradient designs. B L W Chapman and P Mansfield, Meas Sci Technol 6, 349–354 (1995). Quiet transverse gradient coils: Lorentz force balanced designs using geometrical similitude. R W Bowtell and P Mansfield, Mag Res Med 34, 494–497 (1995). A quiet graident-coil set employing optimised, force-shielded, distributed coil designs. B L W Chapman and P Mansfield, J Magn Reson B107, 152–157 (1995). Analytic approach to the design of quiet transverse gradient coils. R Bowtell and P Mansfield, Proc $3^{rd}$ Sci Mtg SMR, Nice, 1, 310 (1995). However, the efficacy of this method is relatively poor.

Two recent approaches which involve active acoustic cancellation of noise within the gradient structure have been proposed (Active acoustic control in quiet gradient coil design for MRI. P Mansfield, UK Patent Application 95068298.2, priority Apr. 1, 1995, PCT WO96/131785, pub. Date Oct. 10, (1996) and Active Control of Acoustic Output in Gradient Coils. P Mansfield, UK Patent Application 9620138.9, priority Sep. 27, 1996, PCT WO98/13821 Pub. Date Apr. 2, 1998) which would in principle solve the acoustic problem completely. However, the characteristics of acoustic wave propagation within the solid support structure means in practice that there are further subtleties which have to be addressed in order to approach complete noise cancellation. It is the purpose of this invention to discuss these subtleties and to propose ways forward which can be translated into practical embodiments.

U.S. Pat. No. 5,332,972 shows a bobbin structure for a gradient field magnetic field generator for MRI. The bobbin is formed such that the thickness of the axial central portion of the bobbin is thicker than that of the axial end portions for enhancing the rigidity on the axial central portion of the bobbin.

An acoustically quiet coil structure for a magnetic resonance imaging system, said coil comprising one or more electrical conductors and comprising a plate of acoustically transmitting material, said electrical conductors being either embedded directly into the plate or into a capping strip attached to the plate, said plate having a plurality of surfaces characterised in that at least one surface of said plate is provided with at least one chisel shaped, serrated or chamfered surface feature to suppress internal reflections of sound waves within the plate.

The present invention also provides an acoustically quite coil structure for a magnetic resonance imaging system, said coil comprising one or more conductors embedded in a plate of material, said plate comprising a composite cellular structure of cellular materials having positive and negative Poisson's ratio $\sigma$ such that the overall $\sigma$ is substantially zero.

The present invention will now be described by way of example with reference to the accompanying drawings in which:

FIG. 1 is a prior art diagram of an acoustic plate with a single rectangular current loop carrying current $I_1$;

FIG. 2 is a sketch showing known prior art details of the acoustic emission process from the emitter surface of width, d. Also shown is an element, dx, of emitter surface at position x and the difference in, acoustic path length $x \sin \theta$ to a distant point P in the x'-plane subtending an angle $\theta$ to the origin, O. For small angles $r \approx r_o$ is the distance between the two planes x,x'. Also shown is the acoustic diffraction pattern with peaks at ±c along the x' axis. The formation of the acoustic interference pattern is considered as a Fraunhofer diffraction process despite the lack of a lens to focus all contributions at point P;

FIG. 3 is an acoustic plate showing an outer current loop with current $I_1$ and an inner re-entrant loop 32 carrying current $I_2 e^{i\Phi}$ mounted on a rigid non-conducting plate (prior art). In addition there is an air gap 34 running most of the way through the middle of the plate. A small section 36,38 each end of the plate is left unslotted to maintain the integrity of both halves;

FIG. 4 is a diagram showing a short section of a plate fabricated from alternate strips of plastic material 42 and metal 40 with acoustic wave 44 incident on one side;

FIG. 5 is a diagram showing emission of acoustic waves from a plastic plate with inlaid wire conductors carrying currents $I_1$, $I_2 e^{i\Phi}$, the whole assembly being immersed in a magnetic field B with field direction normal to the plate surface. (a) Flat plate with blazed outputs $R_1$, $R_2$ and secondary blazed outputs $R_1'$, $R_2'$, $R_1$ originating from the effect of $I_1$ and $R_2$ originating from the effect of $I_2$. (b) Blazed outputs from a plate which is hinged at the centre in order to bring $R_1$ and $R_2$ parallel. Note that when this is done the secondary blazed outputs $R_1'$ and $R_2'$ leave the plate surface at more acute angles. (c) Blazed acoustic output rays from a hinged plate as in (b) above but with additional reflections using two small mirrors to bring $R_1'$ and $R_2'$ parallel with the primary rays $R_1$ and $R_2$;

FIG. 7 shows blazed acoustic output waves from a flat emitter plate normal to the magnetic field B together with a concave sound lens to bring the rays $R_1$, $R_2$ parallel. Also included is a central reflector plate which deflects the alternative blazed outputs $R_1'$, $R_2'$ parallel with the primary outputs $R_1$, $R_2$. The velocity of sound in air is v' and the velocity of sound in the sound lens is v", and v'<v";

FIG. 7 is a diagram of an acoustic emitter plate carrying currents $I_1$, $I_2 e^{i\Phi}$ in which the surface is machined in the form of alternate wedge profiles indicated 1 and 2 on the diagram. Also shown is a side elevation of the machined surface;

Figure 9:
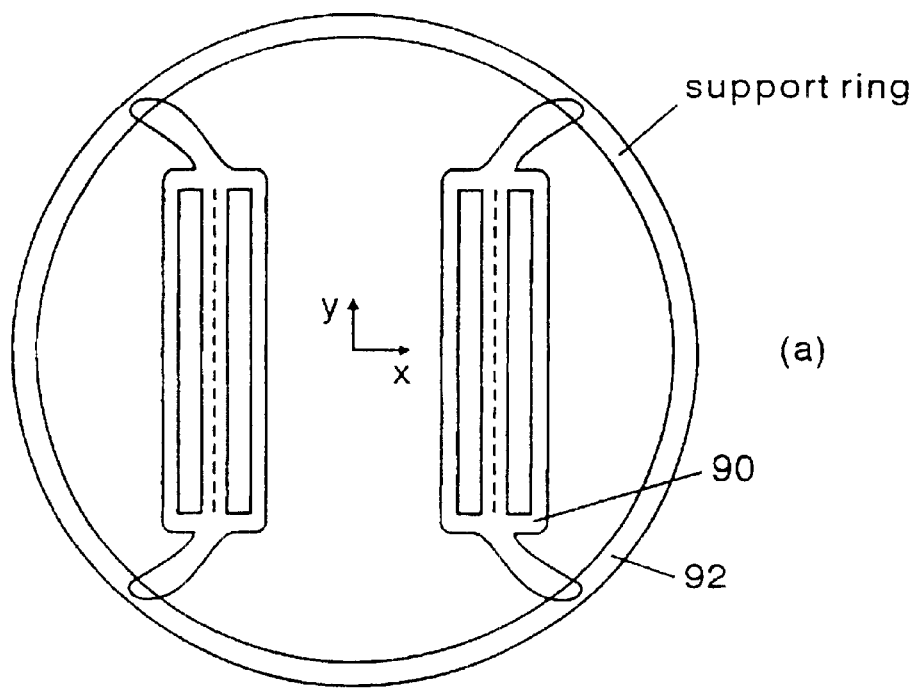
Figure 9:
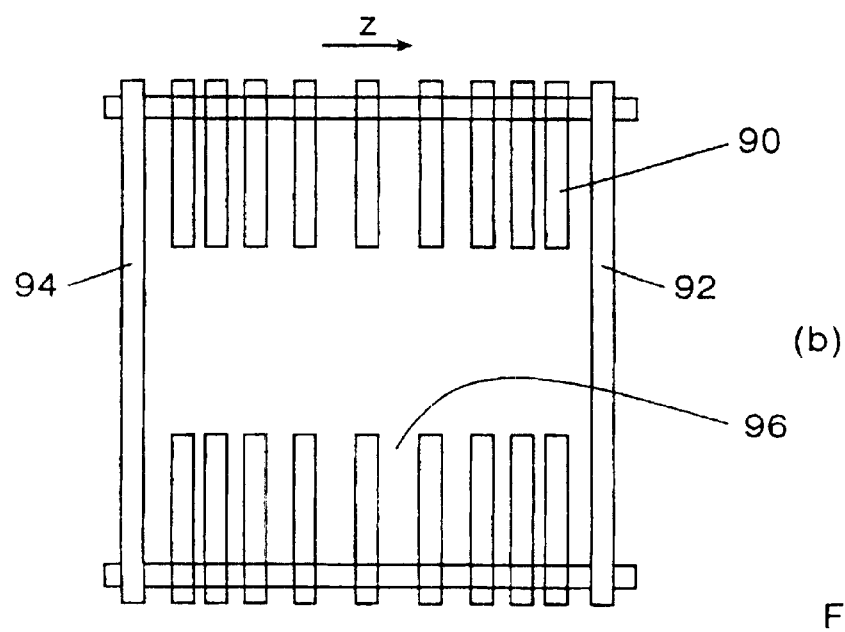

FIG. 9 is a gradient coil plate support arrangement for a stacked plate design. (a) ring support showing plate dispositions for a rectangular plate x-gradient design. The same rectangular plate arrangement can be used to generate x- or z-gradients. The y-gradient plates are the same as those for the x-gradient but rotated through 90°. (b) Plan view of the plate stack showing plate distribution along the z-axis.

NB. Rectangular plates are used as one example of a gradient set design. All three gradients may be generated by arcuate plate designs, or by arcuate designs for x- and y-gradients and circular plates for the z-gradients or mixtures of rectangular, arcuate and circular designs.

Figure 14:
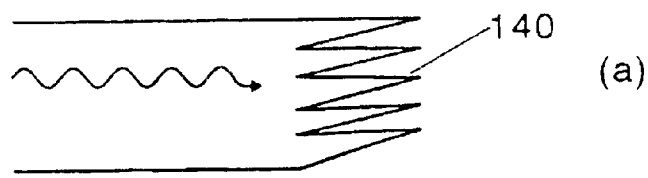
Figure 14:
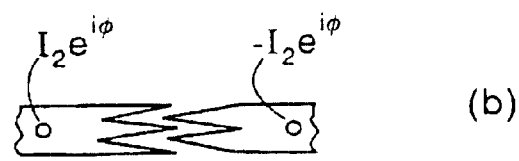
Figure 11:
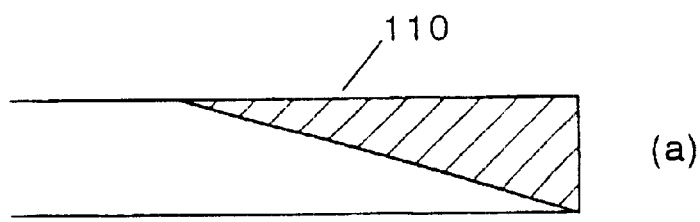
Figure 11:
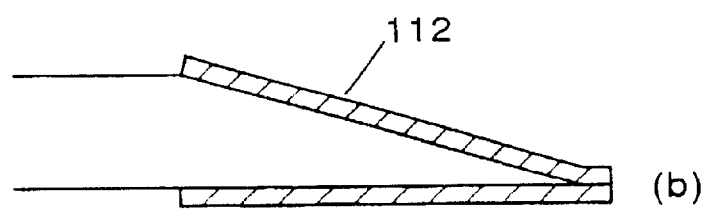
Figure 16:
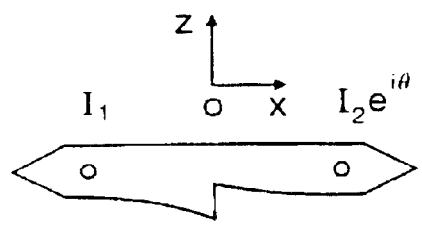
Figure 13:
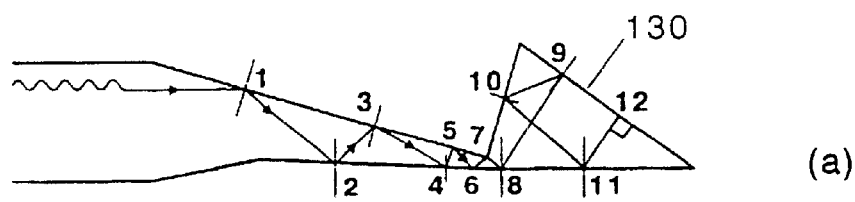
Figure 12:
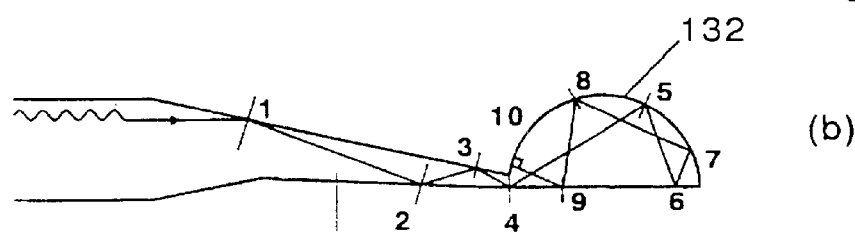
Figure 12:
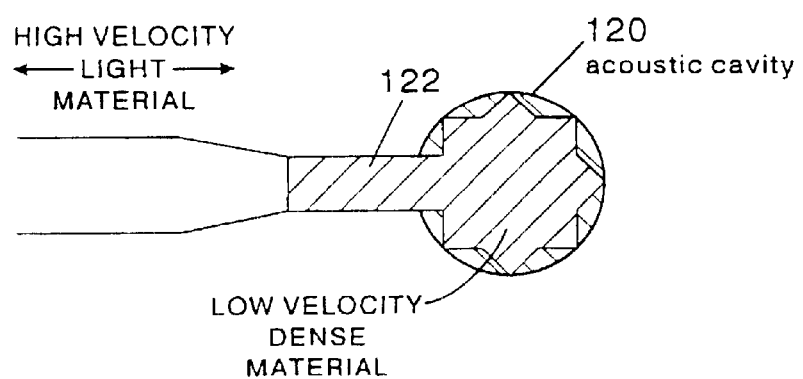
Figure 19:
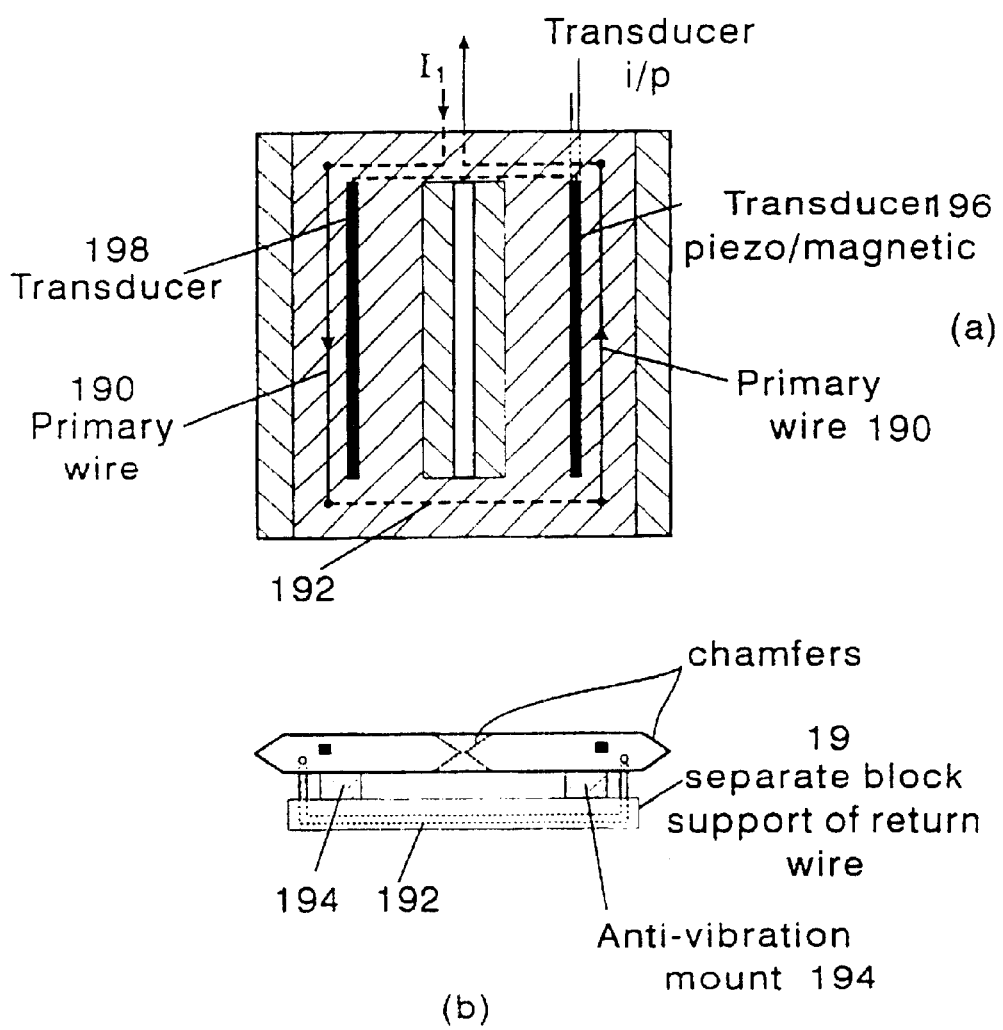
Figure 21:
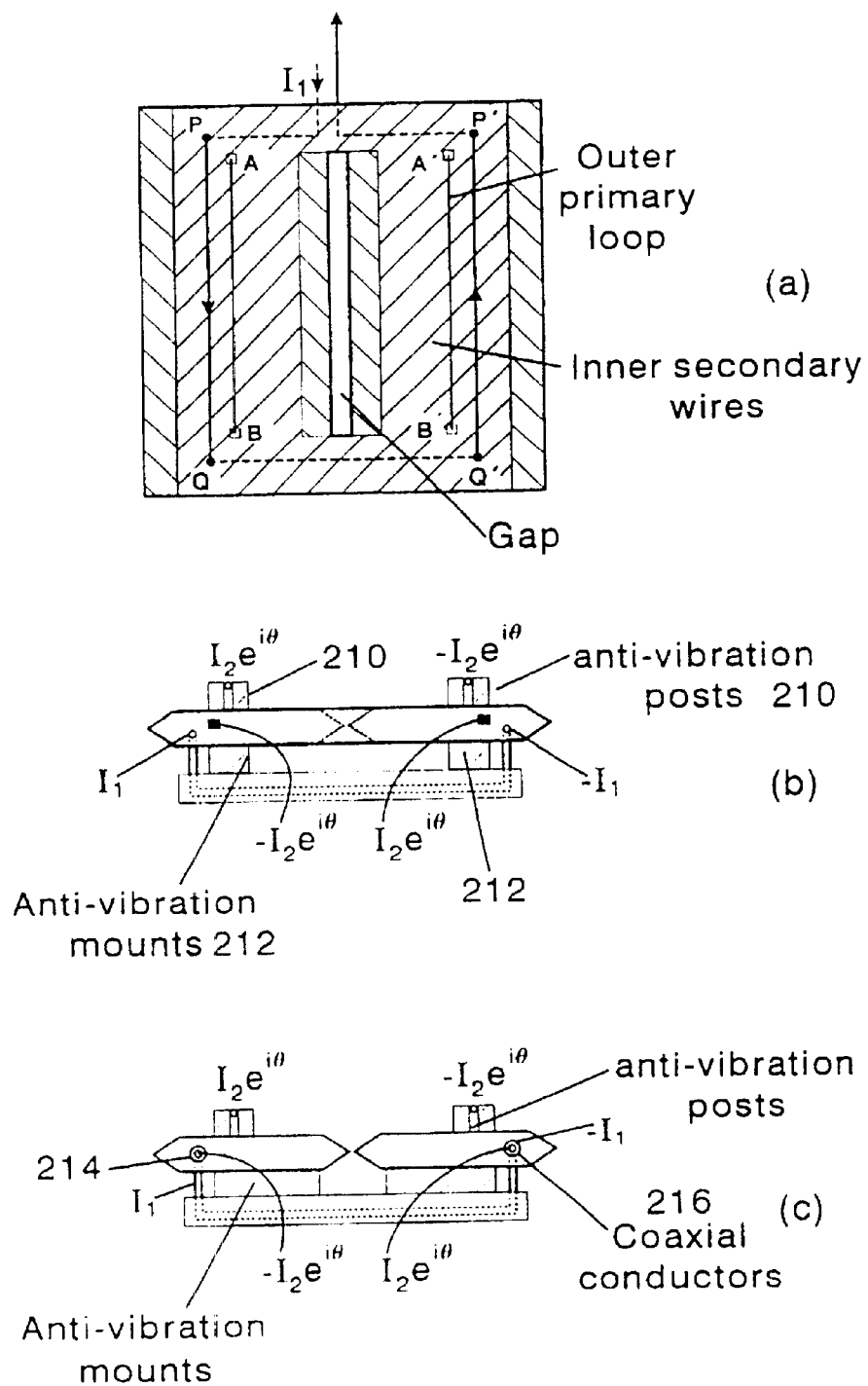

FIG. 10 shows shaped sections through an emitter plate edge. (a) Single chisel chamfer showing 5 internal reflections, the last being normal to the chisel surface. (b) A double chamfer with the same chamfer angle as (a) above and showing 3 internal reflections of an incident acoustic wave, the third being normal to the chamfered edge, (c) alternative tulip form edging and (d) further alternative cusp form edging;

FIG. 11 shows a section through the edge of an acoustic emitter plate which has a single chisel shape chamfer joined to a softer acoustically absorbent material. (a) The acoustic absorber is glued to one chisel surface. (b) The acoustic absorbent material is glued to two chisel surfaces;

FIG. 12 is a sketch showing a section through the edge of an emitter plate which is tapered and fed through a denser material into an acoustic cavity;

FIG. 13 is a sketch showing a section through the edge of an emitter plate which has been tapered with a double taper which feeds into an acoustic cavity. (a) Acoustic cavity is prismatic in shape-and shows 12 internal reflections of an incident acoustic wave, the last being normal to one prismatic surface. (b) A semi-cylindrical acoustic cavity showing 10 internal reflections of an incident acoustic wave, the last being normal to the surface of the semi-cylindrical cavity;

FIG. 14 is a section through the edge of an acoustic emitter plate. (a) The edge has multiple chisel edge serrations. (b) Double chisel shaped serration interlocking but not touching a second plate. Both plates show conductors carrying current $I_2 e^{i\phi}$ and $-I_2 e^{i\phi}$;

FIGS. 15(a) to (c) are diagrams showing variants of the chamfered edge plates with different designs of edge caps. (a) A rectangular shaped cap with a wire current carrying I, placed close to the tip of the chamfer but supported by the cap material. (b) Similar cap arrangements as in a (a) above but with the rectangular corners now angled to reduce reflection back into the main plate. (c) Further modification of (b) above in which serrations are added to the cap material to further reduce internal reflections back into the main plate material;

FIG. 16 is an end view of a plate with outer conductors carrying currents $I_1$ and $I_2 e^{i\phi}$. The plate surface is profiled on one side as indicated. Also shown are the coordinate axes;

FIGS. 17(a) to (e) are diagrams showing the arrangements for serrations or fins on the inner and outer cylinders forming a complete magnetically screened and acoustically screened gradient system. (a) Sketch of part of the end view of the two cylinders showing the mean radii a, b, b' and c of the primary coils, primary coil acoustic shields, magnetic screen acoustic shields and magnetic screens respectively. (b) Fins running along the cylinder axes on all inner and outer cylinder surfaces. (c) Tangential arrangement of fins running on all surfaces of inner and outer cylinders. Fins may form separate grooves or form a threadlike arrangement with small pitch. (d) End view of inner and outer cylinders as in (a) above showing detail of a small section of the longitudinal finned arrangement. (e) Detail of the finned profiles which may be single tapered chisel forms or double tapered wedge forms;

FIGS. 18(a) to (c) are diagrams showing three arrangements for running cooling pipes within the gradient coils. (a) Cooling plates with inset cooling tubes for a stacked rectangular plate gradient coil. Similar arrangements can be used on arcuate plate designs. (b) Cooling tubes run along the cylindrical axis of a cylindrical gradient coil as outlined in FIG. 17. (c) Cooling coil is wrapped in a helical manner between the gradient plates in both inner and outer cylinders of a cylindrical gradient coil as outlined in FIG. 17;

FIG. 19 shows (a) An edge chamfered and slotted acoustic plate with embedded single outer loop or primary carrying current $I_1$. The transverse wire paths pass behind the plate and are supported by an anti-vibration mount. Also embedded parallel to the primary wires are the piezo-electric or magnetic transducers as outlined in FIG. 20(b) End view of plate showing transverse wire support and positions of the primary wires and transducers in the plate. The transducer driver has variable amplitude and variable phase relative to $I_1$;

FIGS. 20(a) to (c) are diagrams showing various transducer arrangements. (a) Diagram of a biopolar/bimorph ceramic piezo-electric transducers. (b) A magnetic transducer formed from a single pair of spaced conductors separated by an insulating flexible material, the conductors carrying currents $I_2$ and $-I_2$ forming a magnetic dipole. The external magnetic field B is normal to the plane through the conductor pair. (c) Two pairs of conductors as shown in (b) above placed back to back so that the outer currents in the double pair have the same current $I_2$ and the inner pair of conductors both carry current $-I_2$. The phase and amplitude of $I_2$ can be varied;

FIG. 21 shows (a) an edge chamfered and slotted acoustic plate with a single outer loop carrying current $I_1$ and two inner secondary wires with current $I_2 e^{i\phi}$ placed close and parallel to the outer loop wires on the long axis of the plate. The transverse wire paths for $I_1$ pass behind the plate supported by an anti-vibration mount. (b) End view of plate arrangement showing the embedded outer wires which form a natural return path in the current $I_1$ in the loop and the secondary wires carrying current $I_2 e^{i\phi}$ which are also embedded in the plate material with their return path in conductors which are weakly coupled to the plate by two outrigger posts at A and B and A' and B'. (c) End view of plate structure as in (b) above but where the conductors PQ and AB and P'Q' and A'B' have been replaced by two coaxial conductor pairs as indicated. Note also that each half of the plate may be separately supported as sketched to allow free and independent vibration.

FIG. 22 shows a sketch showing a portion of an acoustic plate comprising three laminations, each one having a different acoustic propagation constant $k_1, k_2, k_3$. The composite plate may be driven by a single conductor carrying a current $I_1$ or three independent currents $I_1^1$, $I_1^2$ and $I_1^3$, and FIG. 23 shows extruded plastic tubes with cross-sections as indicated (a) and (c) Hexagonal and circular cross-sections in which Poisson's ratio σxy is positive. (b) and (d) Inverted hexagon and inverted circle in which Poisson's ratio σxy is negative.

It can be shown that a rectangular plate 10 placed in a large static magnetic field B in which the field is normal to the plate surface when subjected to transverse compressional or expansional Lorentz forces produces a thickening or a thinning of the plate, such plate thickness changes launching an acoustic wave in air normal to the plate surface along the direction of the applied static magnetic field. The compressional Lorentz forces are produced by wires inset in the plate surface forming a rectangular loop 12, FIG. 1. If the plate width is narrow compared with the plate length, we ignore acoustic transmission along the long plate axis and we concentrate on wave propagation in the transverse direction.

It can further be shown that because of the properties of acoustic transmission in the plate the emitted sound appears as two blazed functions, which in the Fraunhofer limit may be approximated as two sin c functions coming off the same plate at slightly different angles $\pm\theta_c$, to the normal. This behaviour is described by the expression $$|A_{sap}|=a[\sin cb(x'-c)+\sin cb(x'+c)]. \qquad [1]$$

where the approximation $\sin\theta_c \approx \theta_c = c/r_o$ and where $\pm c$ are the displacements of the peaks of the radiated output in a plane parallel to the plate and displaced a distance $r_o$ from it. The amplitude a is given by $$a = \frac{a\bar{d}\sigma\tau\beta\bar{k}F_m\Lambda(\omega)}{r_o} = \frac{2\sigma\tau F_m\Lambda(\omega)}{r_o}bc = \Gamma_1 b_o c_o \alpha\beta = \Gamma_1 bc \qquad [2]$$

where $\Gamma_1$ is given by $$\Gamma_1 = F_m \Lambda(\omega) 2\sigma\tau/r_o \qquad [3]$$

and where $\Lambda(\omega)$ is given by $$\Lambda(\omega) = \frac{1}{\omega[((\omega_o/\omega)^2 - 1)^2 + K^2/\omega^2]^{1/2}} \qquad [4]$$

The other quantities in Eq. [2] are defined as follows; d is the plate width, $\bar{d}$ is the mean plate width, $\sigma$ is Poisson's ratio, $\tau$ is the half thickness of the plate, $F_m$ is the maximum value of the specific Lorentz force per unit length, v is the wave velocity in the plate, $\bar{v}$ is the mean wave velocity in the plate, f is the applied current frequency, $\bar{f}$ is the mean frequency, $\omega=2\pi f$, $\omega_o$ is the fundamental mechanical resonance angular frequency of the plate and K is the viscous damping constant of the plate. The mean wave propagation constant in the solid, $\bar{k}$, is given by $$k=\gamma\beta\bar{k}. \qquad [5]$$

The factors $\alpha$, $\beta$ and $\gamma$ are introduced to take account of minor uncertainties arising from an imprecise knowledge of d, v and f respectively and are defined as $\alpha=1\pm\Delta d/\bar{d}$, $\beta=1/(1\pm\Delta v/\bar{v})\approx 1\pm\Delta v/\bar{v}$ and $\gamma=1\pm\Delta f/\bar{f}$. It follows from error analysis that the product of uncertainties is given by $$\alpha\beta\gamma=1. \qquad [6]$$

In most of the following we may take $\Delta f=0$ so that $\bar{f}=f$ and $\gamma=1$. The other terms in Eq. [2] are defined as follows:

$$b = \frac{\bar{d}k'\alpha}{2r_o p} = b_o \frac{\alpha}{p} \qquad [7]$$

where k' is the acoustic wave propagation constant in air. The sin c functions are displaced around the diffraction origin by $\pm c$ where c is given by $$c = \frac{\bar{k}r_o p\beta}{k'} = c_o p\beta. \qquad [8]$$

The term p is dimensionless and is given by $$\frac{1}{p} = q - 1 \qquad [9]$$

where q is given by $$q = \frac{2k\pi r_o}{\bar{a}\bar{d}ck'} \qquad [10]$$

It is pointed out that $F_m = BI \sin \xi/\rho$ in which B is the static magnetic field, I is the current flowing in the loop, $\xi$ is the angle between the field direction and the current direction and $\rho$ is the density per unit length of the plate material.

For Fraunhofer diffraction we note from Eq. [1] that when x' is zero the acoustic amplitude, $A_{SAP}$, received at point O' reduces to our previous result, (Active acoustic screening: design principles for quiet gradient coils in MRI. P Mansfield, P Glover and R Bowtell, Meas Sci Technol 5 1021–1025 (1994)).

Figure 2:
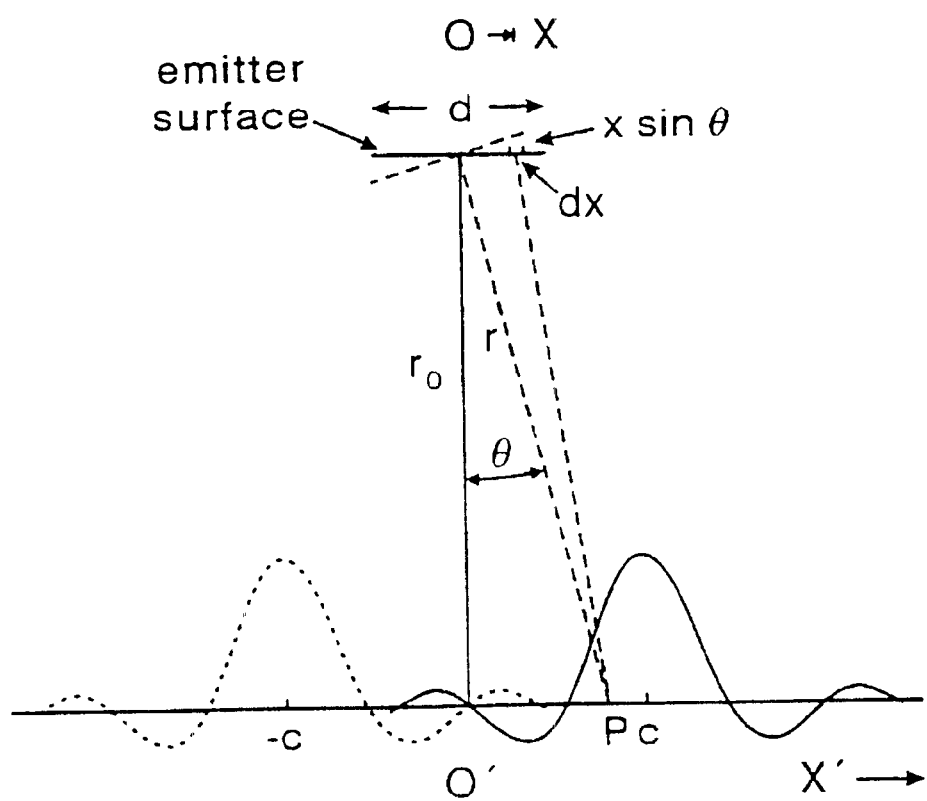

From the form of Eq.[1] it is clear that the acoustic output consists of a diffraction pattern with two peaks occuring at x'=$\pm c$. The emitter plate arrangement and the formation of the diffraction pattern are sketched in FIG. 2.

In a novel embodiment described in our prior art (Active acoustic control in quiet gradient coil design for MRI. P Mansifield, UK Patent Application 95068298.2, priority Apr. 1, 1995, PCT WO96/31785, pub. Date Oct. 10, (1996) and Active Control of Acoustic Output in Gradient Coils. P Mansfield, UK Patent Application 9620138.9. priority Sep. 27, 1996, PCT WO98/13821 Pub. date Apr. 2, 1998)) it has been proposed that the plates should incorporate two loops, a large outer loop 30 carrying a current, $I_1$, and an inner re-entrant loop 32 carrying a current $I_2 e^{i\phi}$, and a central slot 32, FIG. 3. In that arrangement the amplitude and relative phases of the two currents are variable. In that work the acoustic wave central and normal to the plate surface was considered and it was shown that with appropriate currents and phases cancellation of the acoustic wave to a very high degree was possible at one point x'=0.

Figure 1:
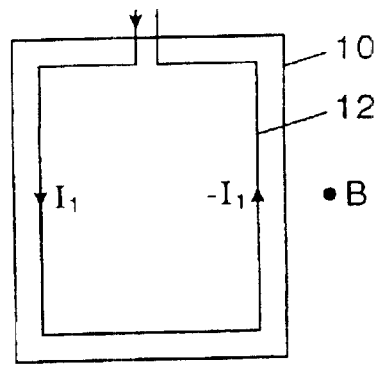

Further theoretical study of that arrangement presented here shows that as with the single loop plate of FIG. 1 the re-entrant loop design also produces an acoustic output which is described approximately by sin c functions, in this case four, two for each half of the plate assembly, as follows $$A_{SAP} = A\left\{\text{sinc}\frac{d}{2}(j\sin(\theta+\theta_o)+k) + \text{sinc}\frac{d}{2}(j\sin(\theta-\theta_o)-k)\right\} + \qquad [11]$$

$$Be^{i\phi}\left\{\text{sinc}\frac{d}{2}(j\sin(\theta+\theta_o)-k) + \text{sinc}\frac{d}{2}(j\sin(\theta-\theta)+k)\right\}$$

where $\theta$ is the annular displacement of the radiated acoustic output, with respect to the centre O of the total plate assembly and $\theta_0$ is the angular displacement of the centre of each half plate with respect to O. The amplitudes A and B are proportional to the outer loop current $I_1$ and the re-entrant loop current $I_2$ respectively. The angle $\phi$ is the relative phase between $I_1$, and $I_2$. By considering the spatial distribution of the acoustic output we can show theoretically from the above expression that complete cancellation of the acoustic wave for each half of the plate assembly is, in principle, possible under the right experimental conditions. These conditions will be examined in some detail in this work and from these conditions a set of embodiments are developed which achieve varying degrees of acoustic wave cancellation.

Blazing

Figure 3:
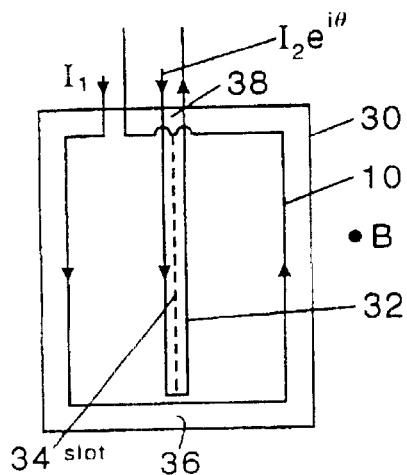
Figure 4:
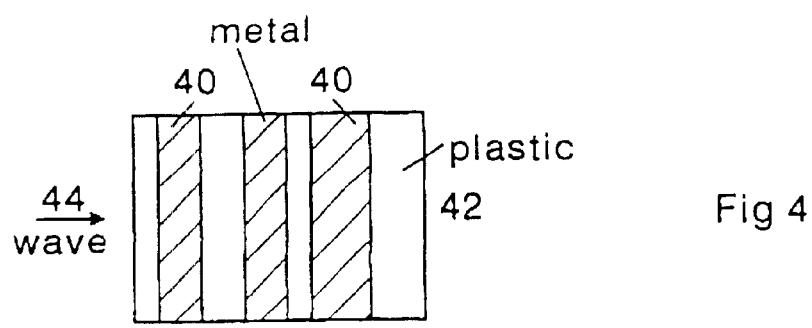
Figure 5:
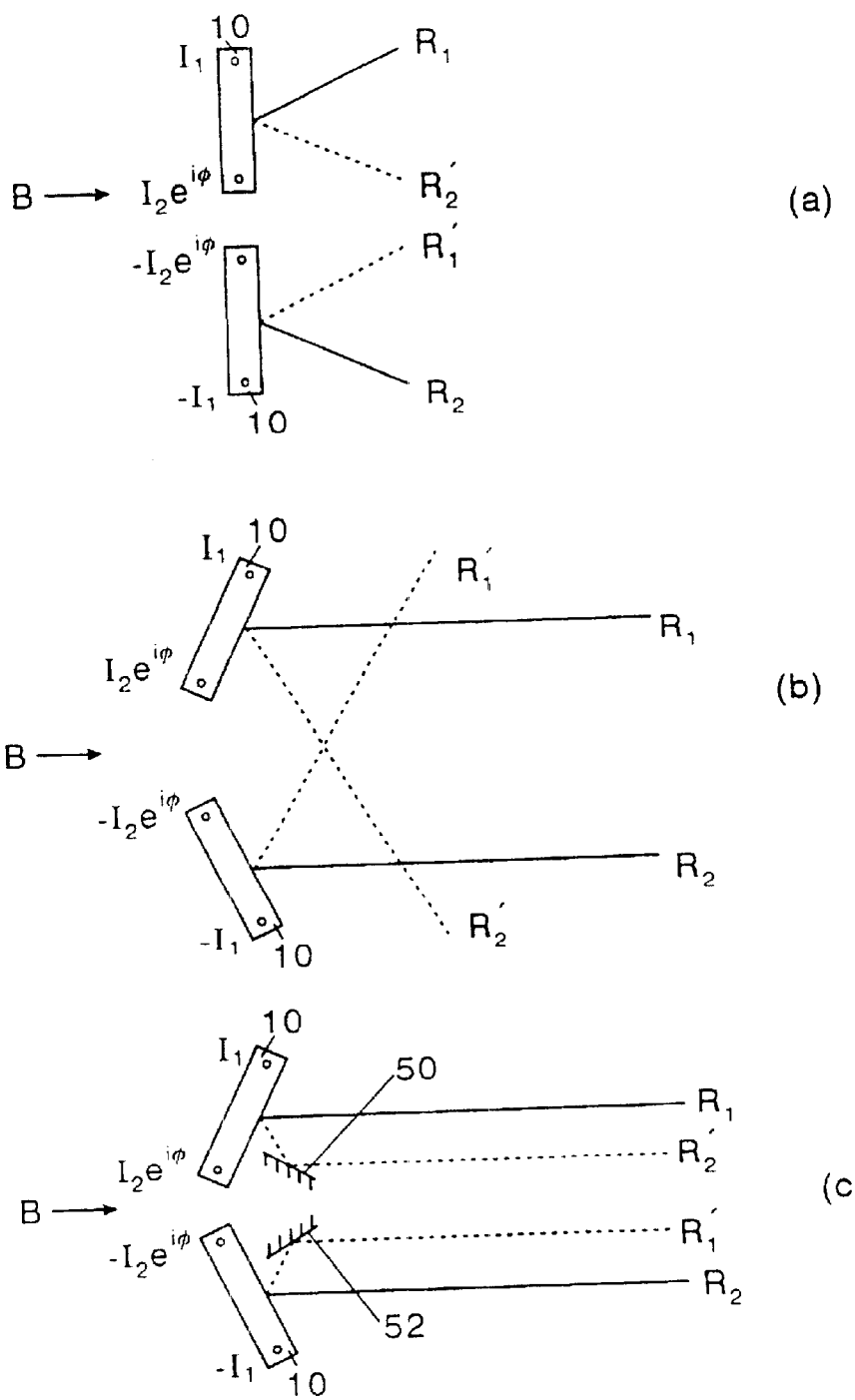

To reiterate the above result; for the re-entrant loop design of FIG. 3 the output is described by four sin c functions as indicated in Eq.[11]. The form of these functions indicates that each sin c output has a non-zero blaze angle. In order to achieve complete wave cancellation the blaze angle ideally should be zero. This implies that the velocity of sound, v, within the plate material should be infinite. For most plastic materials v lies within the range 1–3 kms$^{-1}$. The velocity may be increased substantially by forming composite materials such as glass-filled expoxy resin or metal-filled epoxy resin. The effective velocity of sound may also be increased in the plate by fabricating it using alternate metal 40 and plastic 42 strips as indicated in FIG. 4. A preferred embodiment is one which uses woven carbon-fibre or glass-fibre fabric layers as reinforcement in an epoxy resin. In general, however, one must face the fact that v will always be finite. The question, therefore, is whether one can further reduce the blaze angle by alternative means. FIG. 5(*a*) shows diagramatically output rays $R_1$, $R_1'$ from each half of an energised plate 10 as in FIG. 3. If the phase of $R_2$ is 180° with respect to $R_1$, there is no wave cancellation because the rays do not coincide spatially. FIG. 5(*b*) shows the plate 10 bent in such a way as to bring $R_1$ and $R_2$ parallel. However, this process alone still does not produce destructive interference because the secondary rays $R_1'$ and $R_2'$ have now effectively doubled their blaze angle. In FIG. 5(*c*) small reflecting mirrors 50,52 are introduced near the plate surface which now generate a completely parallel output.

Figure 6:
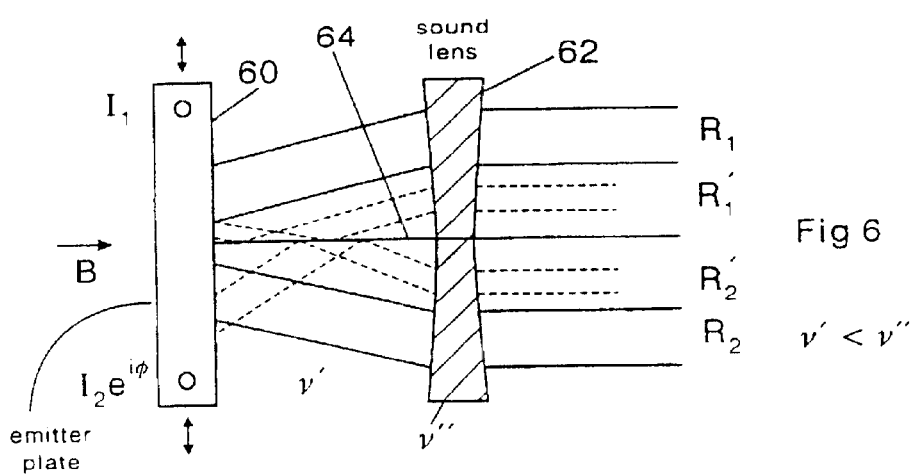

An alternative arrangement is shown in FIG. 6 in which the divergent rays from a flat plate 60 are brought to a parallel output using a sound lens 62 in which the velocity of sound in the lens v″ is greater than the velocity of sound in air, v′. To make this arrangement work the secondary rays are reflected from both sides of a centrally placed mirror 64.

Yet another fixed arrangement is shown in FIG. 7. Here the emitting plate surface 70 is machined into a set of inter-digitated wedges such that the sound wave within the solid generated by current $I_1$ is confined to strips marked 1 and in a similar manner the sound generated by $I_2$ is confined to strips labelled 2. Such an arrangement would produce parallel output across the plate and the efficacy of the destructive interference process would depend on the width of the strips and the spread of the emitted wave in air. A difficulty with the fixed arrangement is that it requires a knowledge of the blaze angle in order to machine the wedge angles.

Figure 8:
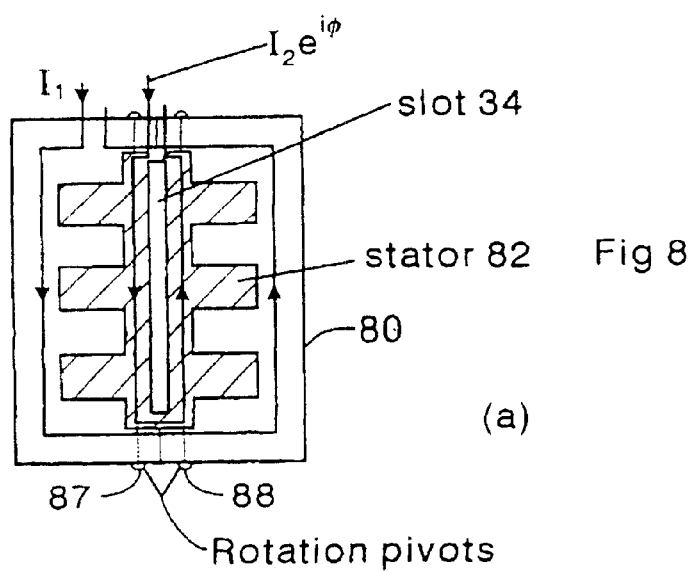
FIG. 8 is a moveable emitter plate carrying an outer current loop $I_1$ and an inner re-entrant loop $I_2 e^{i\Phi}$. The inner re-entrant loop is inset into a castellated stator with central slot. (a) The outer sections of the plate rotate about the stator through rotational pivot points 87,88. (b) Side elevation showing the stator and rotatable outer sections of the emitter plate.
Figure 8:
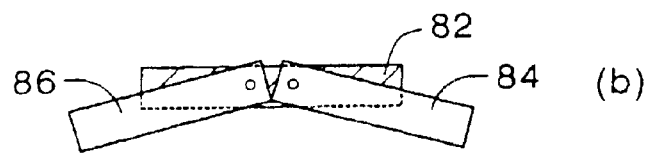

An alternative arrangement for a complete double plate structure 80 which has a mechanical adjustment is shown in FIG. 8. This shows a re-entrant loop arrangement with outer and inner currents $I_1$ and $I_2 e^{i\phi}$. The emitter plate is machined to produce a central stator 82. The outer castellated parts 84,86 of the plate rotate about pivots 87,88 and produce waves along the correct blaze direction to give cancellation as shown in FIG. 8(*b*). As with the discussion of FIG. 7, the efficacy of wave cancellation depends on the number of finger sections in the stator 82 and their width.

Internal Reflections

In order to take this one step further it is necessary to consider the detail of acoustic wave propagation in the solid. In all the theory developed so far internal reflections of the wave have been ignored or overlooked. This turns out to be very important in explaining the details of the sin c function output, especially the width of the sin c function. These considerations lead to a new expression for the double plate assembly given by $$A_{SAP} = A\left\{S_1(\theta+\theta_o, k)\text{sinc}\frac{d}{2}(j\sin(\theta+\theta_o)+k) + \right. \quad [12]$$
$$S_1(\theta+\theta_o, -k)\text{sinc}\frac{d}{2}(j\sin(\theta-\theta_o)-k)\}$$
$$Be^{i\phi}\{S_2(\theta+\theta_o, -k)\text{sinc}\frac{d}{2}(j\sin(\theta+\theta_o)-k)$$
$$\left. S_2(\theta-\theta_o, k)\text{sinc}\frac{d}{2}(j\sin(\theta-\theta_2)+k)\right\}$$

where $$S_1(\theta \pm \theta_o, \pm k) = \frac{\sin(Nd(j\sin(\theta \pm \theta_o) \pm k))}{N\sin d(j\sin(\theta \pm \theta_o) \pm k)} \quad [13]$$

and $$S_2(\theta \pm \theta_o, \mp k) = \frac{\sin(Md(j\sin(\theta \pm \theta_o) \mp k))}{M\sin d(j\sin(\theta \pm \theta_o) \mp k)} \quad [14]$$

N and M in this expression are the numbers of reflections within each half of the plate assembly. For the same material one would expect N to equal M. In most plastic composite materials where the velocity of sound is above 2 kms$^{-1}$ there are observed to be many reflections as judged by the width of the output sin c functions. In situations like this, $I_1$ and $I_2$ are usually close to equality but will depend on the firmness of the wire fixing into the plate. This is commonly done by milling a groove into the plate in which the wire is inset and glued with an epoxy resin. For softer materials it is more difficult to achieve equal amplitudes for the two currents.

From a detailed consideration of the full expression, Eq.[12], it will be noticed that the whole expression can be made to vanish when $I_1=I_2 e^{i\phi}$ with $\phi=2\pi$, and when k=0. This latter condition implies that the velocity of sound in the plate material v equals infinity. This condition is clearly not realisable in practice. To expand on our earlier comments, an infinite velocity may be approached by considering composite plastic materials in which the filler is chosen to increase the overall speed of sound over the basic resin material. A range of inert filler materials is possible including glass and finely divided metals. An alternative way forward is to fabricate the plate with alternate strips of metal and plastic, as shown in FIG. 4. The wider the metal strips the higher the mean velocity of sound across the plate. Suitable metals would include aluminium and copper. If the whole plate were made of metal the highest velocity achievable is, for aluminium 5.1 kms$^{-1}$, and for copper 3.6 kms$^{-1}$. If it were made of glass the highest velocity achievable is 5.0 kms$^{-1}$. These figures are a factor of two or so greater than glass-filled epoxy based composites but still fall short of the requirement for infinite velocity. If we accept a finite velocity it is possible as stated above to get wave cancellation by mechanical blazing.

Further Alternative Approaches

So far we have discussed what happens acoustically within a particular plate segment of a gradient coil system. For the complete gradient coil assembly we envisage many plates suitably spaced along the z-axis so that a uniform gradient field can be generated along all three axes. A particular plate assembly using rectangular plates 90 supported on support rings 92,94 as an example is shown in FIG. 9(*a*). The method for supporting the plate segments means that various plate spacings must be accommodated to achieve the above mentioned gradient uniformity. There will, therefore, be potential air gaps 96 between the plates. This is exemplified in FIG. 9(b).

Because of the relationship $\lambda=v/f$ for a given frequency, the wave length $\lambda$ is directly proportional to velocity of sound. For low velocity of sound as in air the wave length will, therefore, be short and is typically 11.4 cm. This means that there is the potential for sound waves emitting from different plates to constructively or destructively interfere along the propagation axis. Two approaches are possible. The first is to suitably position the plate segments so that at the operating frequency waves cancel. For this arrangement we assume that the acoustic waves generated within the coil assembly propagate through air and through the other plate segments so that in any interference calculation one would need to include not only the velocity of sound in air but the propagation velocity within the plate stack.

An alternative embodiment is to fill the air gaps between plates with a rubber-like material which has a high wave attenuation with the aim of internally absorbing most of the internal wave propagation between plates. Harder and less absorbent materials like polystyrene will have transmission wave velocities of around 1 kms$^{-1}$ and at 3 kHz will give a wave length of 33 cm, but with less attenuation. In general it seems better to fill the air gaps with some solid material which would also help to minimise reflections at the plate segment surfaces. Acoustic waves arriving at the end face of the gradient coil assembly and originating simultaneously from different depths within the gradient-assembly will conspire to interfere destructively, thus adding to the overall attenuation achieved in individual plates. This situation improves for higher frequencies but conversely axial attenuation due to interference will decrease at lower frequencies so that when the wave length in the combined segment and spacing structure is equal to half the coil length, there will be virtually no destructive interference. The output waves from each plate segment will, for uniformly spaced plates, add in a constructive manner to increase the noise output along the axis by approximately N times the output for a single plate where N is the number of plate segments in each half of the gradient coil assembly.

Sinc Function Width Control

We have stated earlier that the width of the sinc function is related to the number of reflections that the acoustic wave undergoes in its passage backward and forwards across the plate. The broadest sinc function occurs when N,M=1. This implies that there are no reflections. In order to achieve such a situation it is necessary to completely absorb the acoustic wave after its first transit. If this were possible it can be shown that for large but finite values of v corresponding to relatively small values of k, wave cancellation can be achieved to a very high degree for the double plate assembly over a solid angle of almost $2\pi$ radians. This statement is based on our calculations using Eq.[12] and a value of k=6 which in turn is based on the use of woven glass-fibre fabric-filled epoxy resin. From our earlier comments, however, it will be seen that k may be made smaller by using woven carbon fibre fabric reinforced plastics for the plate. It is emphasised that this result hinges on the assumption that the acoustic wave in the solid does not undergo reflection at the edges. We now turn to ways of achieving this.

Reduction of Internal Reflections

There are several ways of achieving a plate design which has little or no internal reflection. The simplest and most obvious way is to make a plate from a plastic resin filled with a suitable elastomer. The purpose of the elastomer is to absorb sound energy and provided that the sound amplitude were reduced to zero in the first pass there would be no reflection of the wave. Expressions, Eqs. [12–14], as presented do not include wave absorption terms but they can be included in a straightforward manner, and the result of adding an energy loss mechanism is that the phases of the acoustic waves originating from the individual plate components are severely changed so that wave cancellation becomes difficult. We therefore seek an alternative way of reducing internal reflections but without the use of a loss mechanism within the plate.

This may be done by shaping or chamfering the plate edges and forcing the wave within the chamfer to undergo many internal reflections in such a manner as to be virtually completely absorbed at the plate edges. This process is illustrated in FIG. 10. We show two possibilities; FIG. 10(a) a single chamfer and FIG. 10(b) a double chamfered edge. For the single chamfer or chisel edge 100 we show that the chamfer angle $\epsilon$ is related to the number of internal reflections n before normal internal reflection, by the expression $$n\epsilon = 90°. \qquad [15]$$

For a double chamfered edge 102, as in FIG. 10(b), the number of internal reflections to normal reflection is less and is given by $$\left(\frac{n+1}{2}\right)\varepsilon = 90°. \qquad [16]$$

In order to effectively prevent internal reflections across the plate, it seems necessary to have $n \geq 5$ which for the chisel edge gives a chamfer angle of 18°. Shape variants of the double chamfer are the tulip form 104 FIG. 10(c) and the cusp form 106 FIG. 10(d). In order to improve the absorption of sound at each reflection within a wedge or other shaped edge an acoustically absorbent material may be added to one or two taper surfaces in the form of a block 110, FIG. 11(a), or a thin sheet 112, FIG. 11(b).

Acoustic Matching

An alternative approach to limit or obviate internal reflection is to acoustically match at the edges of the plate. For flat unchamfered edges the solid air interface does not achieve an acoustic match. A condition for acoustic matching is that the energy flux crossing the interface is constant. If air is replaced by another solid the requirement for an acoustic match is that $a_1\rho_1 A_1^2 v_1 = a_2\rho_2 A_2^2 v_2$, where $a_l$, $\rho_l$, $A_l$ and $v_l$ are the cross-sectional area, density, wave amplitude and wave velocity of the lth medium respectively. This equation means, therefore, that to maintain the flux density across the interface from a high velocity to low velocity the acoustic amplitude and/or density in the low velocity medium must be increased. The acoustic impedance $Z=\rho v$. We also note that the reflection coefficient at the interface between two media $\Gamma=(Z_1-Z_2)/(Z_1+Z_2)$ so that for $\Gamma=0$, $Z_1=Z_2$. When the two materials are impedance matched an acoustic match may be achieved, therefore, by tapering the harder material into a butt join with the denser lower velocity material. Having achieved an acoustic match it is then necessary to completely absorb the energy in the denser material. This may be done by a mixture of chisel tapering and high acoustic attenuation within the lower velocity material. Suitable materials for the high velocity medium could be laminated glass- or carbon-fibre woven fabric impregnated with epoxy resin. The lower velocity medium could be a lead alloy or a pewter.

Yet another method of acoustic absorption is to let the acoustic wave now trapped in the lower velocity medium 122 radiate into an acoustic cavity 120 as shown in FIG. 12.

Several taper arrangements together with cavities are shown in FIG. 13. A double taper arrangement, FIG. 13(*a*), is shown feeding a prismatic cavity 130. In this arrangement it is possible to achieve as many as twelve internal reflections (numbered) of the incoming acoustic wave. The double taper arrangement prevents some of the incoming radiation entering directly into the cavity. In FIG. 13(*b*) a semicircular cavity 132 is demonstrated also with a double taper. The number of internal reflections is indicated and is similar to FIG. 13(*a*) above.

One of the difficulties with cavity arrangements as described is that they extend the plate width by several centimetres. In general this is an undesirable feature, but the achievable attenuation is very high. An alternative to both the cavity arrangements and the single chisel edge arrangement is to use a multiple chisel or serrated edge 140 as shown in FIG. 14(*a*). Here it is possible to achieve the desired taper angle without extending the plate edges too much. The serration may be achieved by machining a solid block or alternatively by a laminated sheet structure in which individual chisel tapers are applied to the sheets before assembly.

The serrated edge may be used to advantage in an interlocking arrangement as shown in FIG. 14(*b*) for the inner re-entrant loop. The outer current loop is not shown. The interlocking arrangement allows the inner loop width to be substantially reduced.

Figure 15:
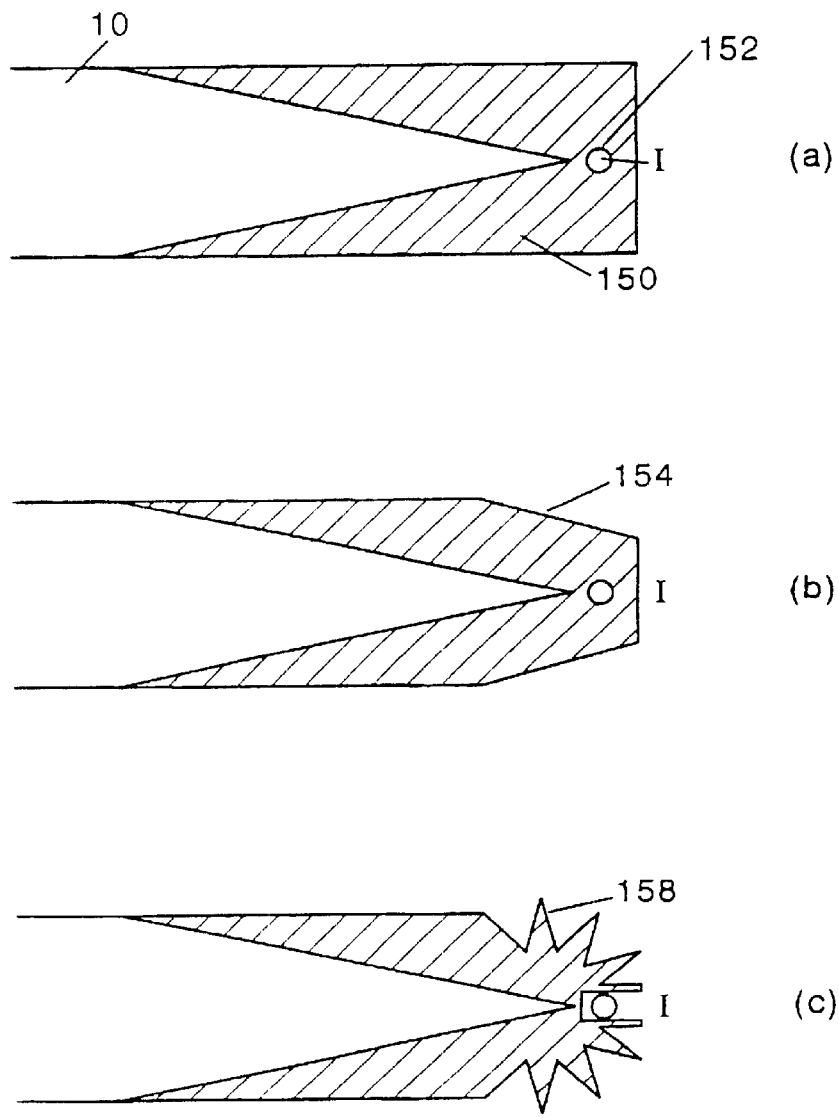

An extension of the simple approach of FIG. 11 is shown in FIG. 15. Here the tapered edge of the high velocity plate 10 material is mated into a vee groove of a second edge capping strip 150 (shaded) of lower velocity material which also houses the active wire 152. Sound waves which pass into the capping strip 150 from the main plate are internally reflected and attenuated, FIG. 15(*a*). The internal reflection process is improved by angling the corners 154,156 of the capping strip, FIG. 15(*b*). For even further internal reflection and attenuation efficacy, the edges of the capping strip may be serrated 158 as in FIG. 15(*c*).

Plate Profiling

In deriving Eq.[11] or Eq.[12] it is assumed that the plate thickness $2\tau$ is constant. If, however, the plate is profiled with the thickness a function of distance, $\tau(x)$, such that $$\tau(x)\sin kx = h \quad [17]$$

where h is constant, then for a particular value of k $$\tau(x) = \frac{h}{\sin kx}. \quad [18]$$

In this case, it can be shown that k in Eq.[11] or Eq.[12] effectively vanishes and all blaze angles are zero. This immediately collapses $A_{SAP}$, to zero. A profiled plate cross-section 160 is shown in FIG. 16.

Practical Gradient Coil Arrangements

Provided that the velocity of sound in the supporting medium is of the order of 2.5 kms$^{-1}$ or higher, and provided that all internal reflections are suppressed by the means described above, it is possible to propose a number of practical coil arrangements. These include assembled plate structures comprising rectangular plates, circular plates and arcuate segment plates, all of which can be assembled to form a three axes, x, y, z, gradient coil set. Examples of gradient coils using plate segments with rectangular, circular and arcuate structures are given in our prior art (Active acoustic control in quiet gradient coil design for MRI. P Mansfled, UK Patent Application 95068298.2, priority Apr. 1, 1995, PCT WO96/31785, pub. date Oct. 10, (1996) and Active Control of Acoustic Output in Gradient Coils. P Mansfield, UK Patent Application 9620138.9, priority Sep. 27, 1996, PCT WO98/13821 Pub. date Apr. 2, 1998), see also FIG. 9.

This type of gradient set comprising the above described plates stacked into a complete gradient set usually produces relatively short gradient coils and this design is useful for manufacturing head gradient coils. For whole-body imaging using acoustically controlled coils, because of space constraints in a 1.0 m bore magnet for example, it is better to consider cylindrical coil structures of the distributed arc kind.

Cylindrical Distributed Coils

Figure 17:
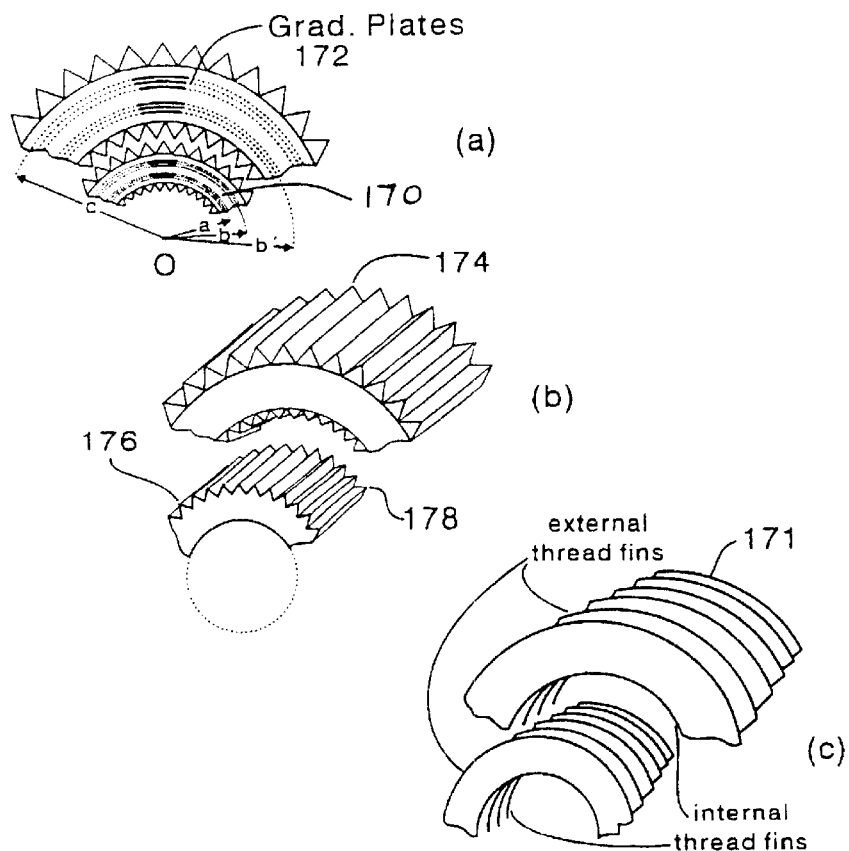

Cylindrical distributed coils will, in general, comprise an inner cylinder 170 supporting three primary coils, x, y, z, with mean radius a, and an outer cylinder 172 supporting three magnetic screening coils with mean radius c. Interposed between these magnetic coils are two sets of three acoustic screening coils supported by the inner and outer cylinders at mean radii b and b' respectively. The arrangement is sketched in FIG. 17(*a*). In order to benefit from the acoustic control principles it is necessary to make sure that the cylindrical waves generated within the solid support medium are completely absorbed at the cylinder surfaces. This means that it is necessary to machine on all surfaces sets of serrated grooves, notches, knurls or fins 174, running along the cylindrical axes as indicated in FIG. 17(*b*). The inner cylinder with sound propagation velocity, $v_1$, and outer radius b will also have serrated grooves 176 or fins which will mesh with, but not touch, a similar set 178 on the inside surface of the outer cylinder with sound propagation velocity, $v_2$. The inner and outer cylinders 170,172 must be free to vibrate readily and this will necessitate some relatively light coupling support between the two cylinders. A suitable material could be soft rubber which would be posted into the gap between fins at strategic points. Most of the gap between the two cylinders will be left free. These fins would be machined into the cylinder surface after casting, or alternatively they could be cast with the cylinder in a suitably shaped mould. A further alternative would be to glue the fins onto the smooth cylindrical surfaces.

An alternative arrangement shown in FIG. 17(*c*) is one where the fins 171 run tangentially to the cylindrical surfaces forming a threadlike structure on all cylindrical surfaces.

Two fin shapes are shown in FIGS. 17(*d*) and 17(*e*) which would be suitable for both arrangements, (a) and (b) above. The groove angle and depth are controlled by Eqs.[15 and 16].

Cooling

In all practical gradient coil arrangements it may be necessary to cool the windings if very large currents are being used. Because of the precision and delicacy of the acoustic control principle, relatively small diameter copper wire is used for all windings using the segmental stacked plate approach. For the cylindrical distributed gradient coil designs the windings are best achieved by etching or by punching or stamping out the wire paths in a continuous sheet of copper of relevant thickness. For the three axes such copper sheets must be suitably insulated from each other. Again the copper sheet will be relatively thin in order to accommodate the critical dimensions in the acoustic design. This will therefore, in general, necessitate some fluid cooling tubes for the cylindrical coils as well as the stacked plate coils.

Cooling of the stacked plates 181 is best achieved by using additional cooling plates 180 interleaved appropriately between the gradient plates and in which the cooling coils 182 may be thin copper tubing wound in such a way as to correspond closely to the actual current carrying windings. This arrangement is shown in FIG. 18(*a*).

For the cylindrical coil structure each set of three copper sheet conductors may include two layers of cooling. In one arrangement the cooling tubes 184 could be copper running backwards and forwards along the cylindrical axis, FIG. 18(*b*). Because there are four sets of three stamped copper sheets it would be necessary to have four cooling arrangements for the coils.

Figure 18:
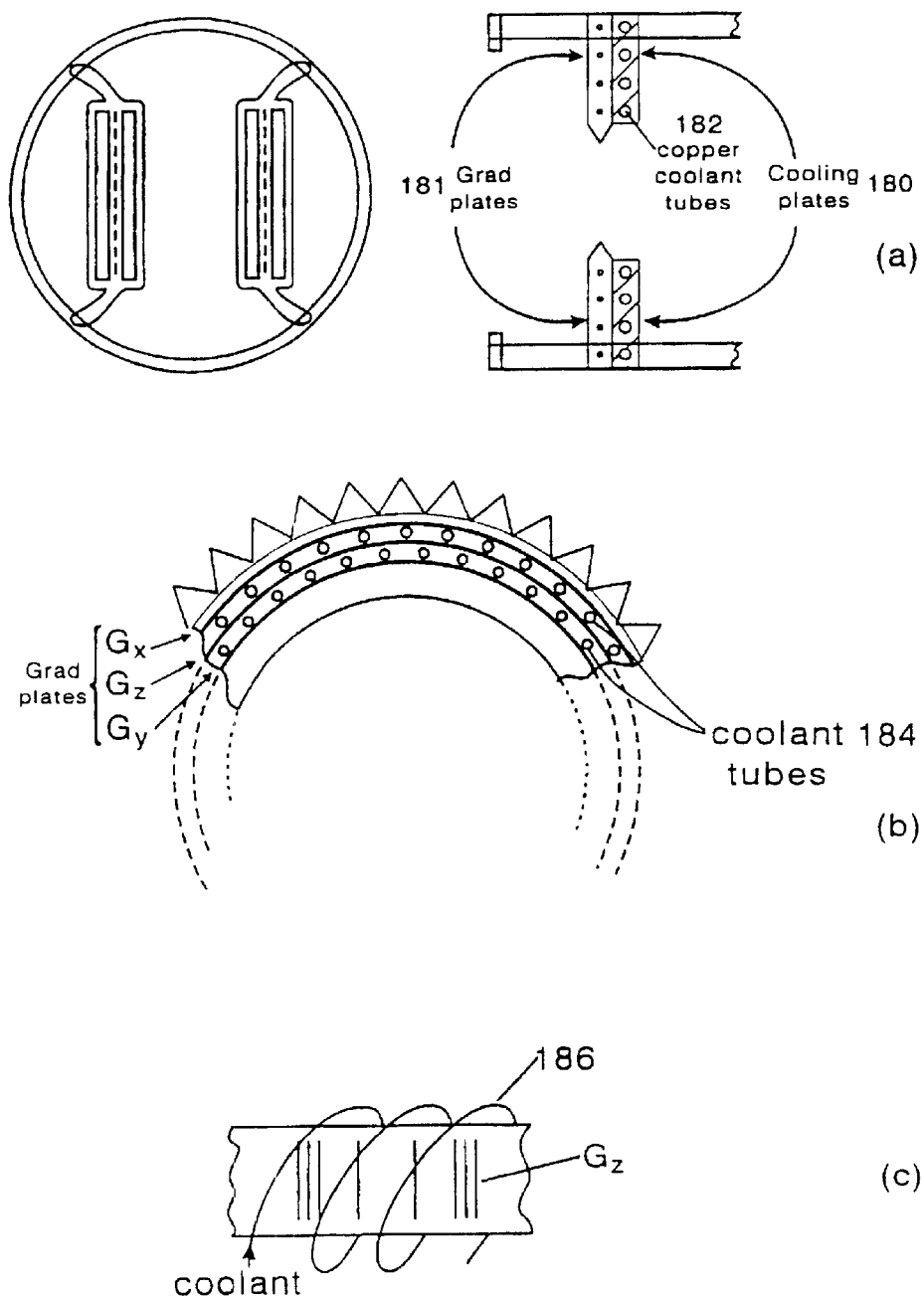

An alternative arrangement is to have the copper tubes 186 wound in a helical manner but between the gradient windings, FIG. 18(*c*).

Localised Transducers

Although the above ideas concerning acoustic wave cancellation have been demonstrated to work, the degree of efficacy depends as we have already said on the value of k. Furthermore, the actual cancellation process occurs in the medium k'. When this medium is air this can present problems by virtue of the transmission process through air and its perturbation due to localised objects, reflections etc.

We now investigate the possibility of true cancellation within the solid comprising the gradient support system. In order to achieve this what we require ideally is a wave which has the same amplitude and is travelling in the same direction as the wave to be cancelled, but with opposite phase. One approach would be to include a second wire which is close to the first wire but with equal and opposite current flow. This would indeed cancel the wave as required but the price paid would be zero gradient strength in the gradient coil. However, we shall return to this arrangement later. Rather than introduce a single wire we therefore investigate the possibility of placing a transducer or transducers in the vicinity of the wire in order that the transducer would generate the requisite cancellation wave in the solid.

The use of piezo-electric transducers in connection with gradient coil design has been described in our prior art. However, in that work the piezo-electric device was intended primarily to replace the centrally placed re-entrant loop arrangement for gradient coil cancellation. But as we have said above, that arrangement in fact does not produce acoustic wave cancellation within the solid structure of the gradient assembly.

In what follows we will concern ourselves specifically with situations where wave cancellation within the solid occurs. Suitably placed piezo-electric transducers near to the gradient generating wires in a gradient assembly could, in principle, generate waves of sufficient strength to cancel the waves in the solid. If this occurs the gradient assembly becomes instantly silent. The principle that we now consider is shown diagramatically in FIG. 19(*a*). In this arrangement we have two primary wires 190 forming part of the primary loop carrying current $I_1$. The transverse return wires 192 are placed behind the plate on a separate anti-vibration mount 194,195, FIG. 19(*b*). The primary wires are embedded in the plate, which is slotted in the centre and bevelled on all inner and outer longitudinal edges. Slightly displaced from the primary wires and running parallel are machined slots which take the transducers 196,198. These also are embedded using epoxy resin.

Figure 20:
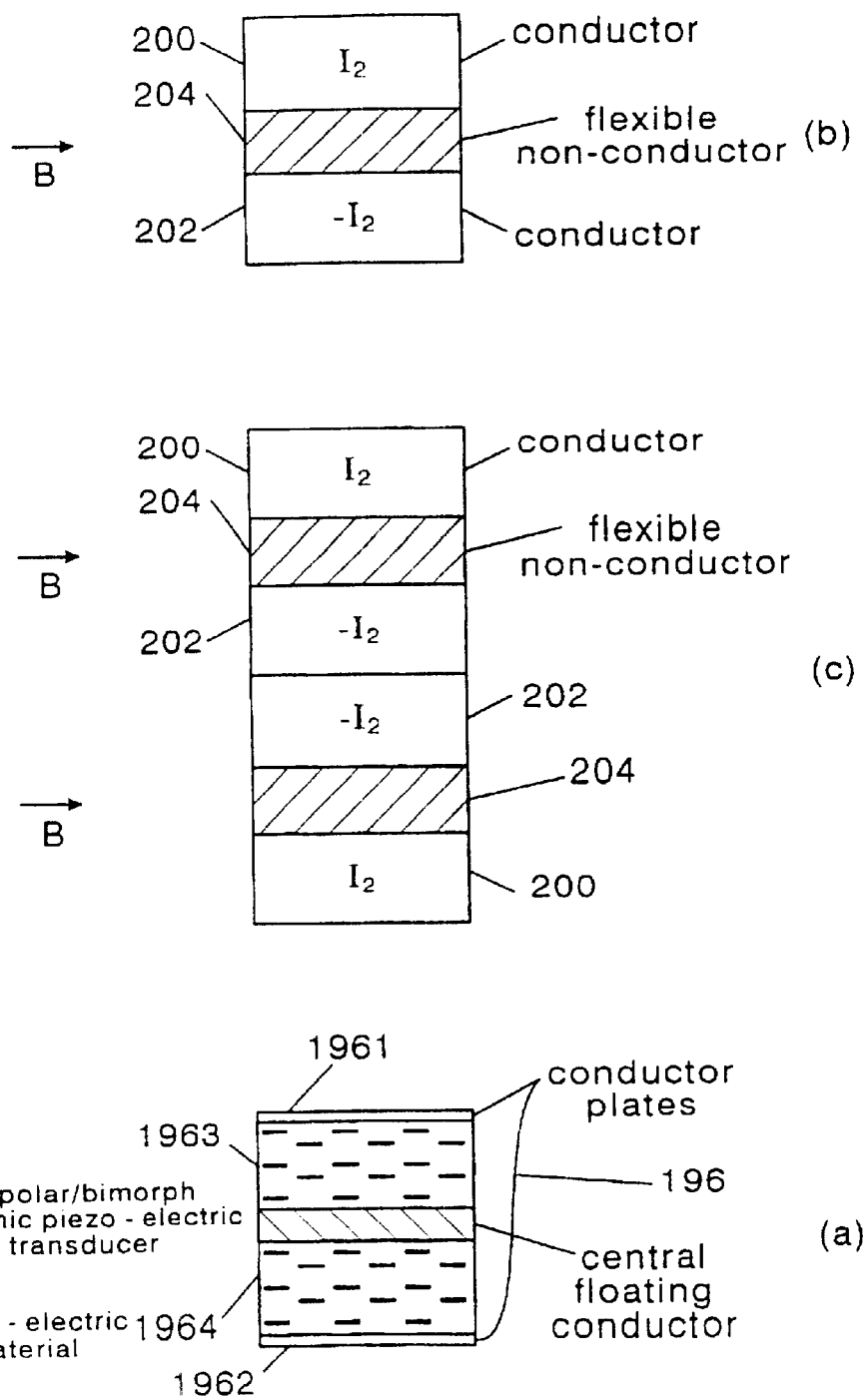

A suitable piezo-electric device 196,198 is shown in FIG. 20(*a*) and comprises two conductor plates 1961,1962 a central floating conductor 1965 and two plates 1963,1964 of piezo-electric material.

While we have mentioned above piezo-electric devices 196,198, shown in cross-section in FIG. 20(*a*), it is entirely possible and may even be preferable to use magnetic current transducers comprising two thin strips of copper conductor 200,202 sandwiching a flexible spacer 204. This may be preferable by virtue of the fact that a) it is simpler to construct and b) would be continuously distributed throughout the coil system whereas piezo-electric devices would have to be placed at specific strategic points within the coil assembly. It is clear that a magnetic current transducer as indicated in the end view of FIG. 20(*b*) will, in principle, produce vibrations which could cancel the aforesaid generated waves, but if we examine the production of acoustic waves from a single wire and then from a magnetic transducer we see that in the case of a single wire which is embedded in a solid generation of an acoustic forward and backward wave is continuous through the origin at which the wire is sited. That is to say forward propagation is accompanied by a negative amplitude wave in the backward direction. This contrasts with the case of a magnetic current transducer which is in fact a magnetic dipole. In this case the forward and backward waves generated from the transducer are both positive. Therefore, placing a magnetic transducer of the type shown in FIG. 20(*b*) close to a single wire will produce cancellation in either the forward or backward direction, but not both at the same time. This may, nevertheless, have some value if forward transmission occurs in a larger space than backward transmission. It would have the effect of confining the backward wave, albeit at higher amplitude, into a restricted volume of the support structure where it may be dissipated without creating excessive noise.

A further embodiment of this approach would be to use two magnetic current transducers in such a way that the forward and backward faces carry the same current. Such an arrangement is shown end view in FIG. 20(*c*) and shows effectively two magnetic dipole arrangements back to back. If the current in a single wire has the same phase as the current in the front and rear places of the transducer, similar forward and backward waves would be transmitted in the solid by both the single wire and the double transducer. In this circumstance complete cancellation of the acoustic wave within a solid seems possible.

The piezo-electric equivalent of the double magnetic current transducer is simply to use a bipolar or bimorph device comprising two piezo-electric ceramic devices back to back with a conductor material between the inner faces. The outer faces should include conducting surfaces and be in firm contact with the solid material comprising the gradient support. The piezo-electric device referred to earlier in FIG. 20(*a*) is such a bipolar device.

We now return to the use of a pair of secondary wires in close proximity to the gradient producing primary wires of a single rectangular wire loop, for example the arrangement shown in FIG. 21(*a*). The primary wires PQ and P'Q' which are embedded in the plate, provide a natural return path for the current $I_1$. The transverse wire paths for $I_1$, run behind the plate and are separately supported on an anti-vibration mount 212 FIG. 21(b). The secondary wires, AB and A'B', which are also embedded in the plate, each have return paths for the current $I_2 e^{i\phi}$ in the form of largely unsupported wires held off the plate surface by anti-vibration outrigger pylons or posts 210, (see FIG. 21(b)), which minimise coupling to the plate. This latter point being achieved by using suitable materials in the form of an anti-vibration mount. FIG. 21(c) shows a similar arrangement to FIG. 21(b) but with conductors PQ and AB, and P'Q' and A'B' replaced by coaxial pairs 214,216.

If the current return paths of the secondary wires are close to the plate, magnetic fields produced by $I_2 e^{i\phi}$ will cancel at the centre of the gradient assembly.

Consider one half of the plate, FIG. 21. Within the solid a plane wave is launched from wire PQ travelling left to right and is described by the expression $$A_1 = A_{10} e^{i(kx + \omega t)}. \quad [19]$$

Similarly a wave is launched from wire AB with amplitude and relative phase given by $$A_2 = A_{20} e^{i(k[x + \Delta x] + \phi + \omega t)}. \quad [20]$$

The total wave amplitude within the solid $A_{tot}$ is therefore $$A_{tot} = \{A_{10} + A_{20} e^{i(k\Delta x + \phi)}\} e^{i(kx + \omega t)} \quad [21]$$

where $\Delta x$ is the distance between the two wires. The wave amplitudes $A_{10}$ and $A_{20}$ are proportional to the current amplitudes $I_1$ and $I_2$ and are therefore experimentally accessible. If $A_{10} = A_{20}$, $A_{tot}$ can be made to vanish if the total phase $k\Delta x + \phi = 2\pi$. Under these conditions the plate should be silent.

FURTHER IMPROVEMENTS IN ACOUSTIC CONTROL

In most of the flat plate designs both halves of the plate are fixed to each other at top and bottom to maintain their integrity. In a modification of this arrangement each half of the plate is free to vibrate in a free vibrator mode. Integrity of the plate pair is maintained through supporting bars at the rear top and bottom of the plate pair. The support bars are lightly attached to each plate through an anti-vibration mounting in the form of adhesive pads.

Laminated Plates

Improved efficacy of acoustic cancellation could occur if the plate acoustic output were independent of k. FIG. 22 shows a section of plate comprising three or more laminations forming a composite. Each lamination is formed from a multilayer woven fabric reinforced plastic composite having a different wave propagation constant, ie $k_1, k_2, k_3 \ldots k_n$, where $k_n = nk$. For n odd it can be shown that the acoustic output comprises Fourier components which describe the deformation of the overall plate structure. By choosing the values of k it is possible to shape the overall plate deformation to any desired function of the plate co-ordinate, x. The current drive to the plate system would be a sinusoidal or co-sinusoidal function. Two simple plate deformations are when the sum of the Fourier components produce either a uniform displacement of the plate surface or a linear ramped displacement of the plate surface as a function of x. In this case the Fourier transform of the plate profile gives either a sinc function or a differentiated sinc function neither of which depends on k.

Anisotropic Materials

We notice from Eq. [3] that the acoustic output depends on Poisson's ratio, $\sigma$. If $\sigma$ were zero there would clearly be no output. In most materials $\sigma$ is not zero but there is a class of material where $\sigma$ can be negative as well as positive. Combinations could therefore exist in which negative and positive values coexist making the overall Poisson's ratio zero. These materials are cellular solids. In general in cellular solids $\sigma$ is highly anisotropic.

Consider three axes x, y and z in a cellular solid. In such a solid one can have various values of Poisson's ratio, namely $\sigma_{xy}, \sigma_{yx}$; $\sigma_{xz}, \sigma_{zx}$ and $\sigma_{yz}, \sigma_{zy}$ where $\sigma_{ij} = \epsilon_i / \epsilon_j$ in which $\epsilon_i, \epsilon_j$ are strains along the i- and j-axes respectively when stress is applied along the i-axis. For a cellular solid comprising bundles of fine tubes where the tube axis is z, we expect $\sigma_{xy} \approx \sigma_{yx} = \sigma, \sigma_{zx} = \sigma_{yz} = 0$ and $\sigma_{zx} = \sigma_{zy} = 1$.

A natural cellular solid is wood. In this material approximate tubules run along the trunk axial direction A. The radial and tangential directions with respect to the trunk axis are denoted R and T respectively. For many types of wood $\sigma_{RA} \approx \sigma_{TA} \approx 0$. Theoretically $\sigma_{AR} \approx \sigma_{AT} = \sigma$ and $\sigma_{TR} = \sigma_{RT} = 1$. In practice for hardwood $\sigma_{RT} \approx 0.75$, $\sigma_{TR} \approx 0.35$, $\sigma_{AR} \approx 0.45$ and $\sigma_{AT} \approx 0.5$. This means that if our gradient plates are made of wood such that the Lorentz forces are applied across the wood grain axis, $\sigma_{RA}$ or $\sigma_{TA}$ are substantially zero. In this case Eq.[3] dictates that the acoustic output amplitude is greatly reduced. A factor of 10 reduction in $\sigma_{RA}$ gives a 20 dB noise reduction without acoustic control. Further noise reduction should be obtainable using the acoustic control principle. In our example we have considered wood. But of course fabricated cellular materials could be used instead and could possibly better approach the desired $\sigma = 0$.

Fabricated cellular materials can have negative values of $\sigma$. We therefore propose composite cellular materials comprising both positive and negative values of $\sigma$ such that overall $\sigma = 0$. FIG. 23 shows four tube cross-sections, FIGS. 23(a) and (c) having a positive $\sigma$ and FIGS. 23(b) and (d) a negative $\sigma$. Honeycombs comprising alternate layers of tubes with these cross-sections each pair of layers having a positive $\sigma$ and a negative $\sigma$ should have an overall $\sigma$ which is close to zero. The arrows $\mp F$ denote forces producing strains, $\epsilon_x$. $\epsilon_y$ denotes corresponding strains along the y-axis.

The above are particular examples of materials which exhibit anisotropy, in this case in Poisson's ratio. This anisotropy also gives rise to materials which have different velocities of sound along two or more axes. Anisotropy of sound velocity can be a useful feature in designing acoustically controlled plates. Such plates could be arranged to have a high velocity along one axis and a much lower velocity along an axis orthogonal to it. With such materials a plate could be made to resonate in, say the long axis by virtue of its lower velocity, but along the short axis where the velocity is high acoustic blazing could be minimised.

We have mentioned earlier composite materials comprising multi-layer woven glass fibre and woven carbon fibre plastic composites laminates and, of course, such materials are isotropic along two axes x and y but could be substantially anisotropic along the direction normal to the layers. If anisotropy in the x-y plane is required, it is possible to weave new types of material in which the warp and weft fibres are of different materials, for example glass fibres for the warp threads and carbon fibres for the weft threads. Such materials should exhibit very large anisotropies in the x-y plane making it possible to design acoustic plates with different acoustic wave velocities along the x and y axes.

Summarising the anisotropic effects in Poisson's ratio, the situations where we would expect $\sigma_{TA} = \sigma RA = 0$ are, tube bundles, extruded plastic forms, woods and foam composites. It is also possible to get at least one other component, $\sigma_{RT}=0$, if we use combined extrusion forms in the case of extruded plastics. Considering the plate itself, an important design parameter is the radiation factor $f_r=\sqrt{(E/\rho^3)}$. Substituting for acoustic velocity this gives $f_r=v/\rho$. This suggests that for minimum $f_r$ and given velocity, v, $\rho$ should be maximised.

What is claimed is:

1. An acoustically quiet coil structure for a magnetic resonance imaging system, said coil comprising one or more electrical conductors and comprising a plate of acoustically transmitting material, said electrical conductors being either embedded directly into the plate or into a capping strip to the plate, said plate having a plurality of surfaces in which at least one surface of said plate is provided with at least one chisel shaped, serrated or chamfered surface feature, said surface feature providing means for suppressing internal reflections of sound waves within the plate.

2. An acoustically quite coil structure as claimed in claim 1 in which the acoustically transmissive material is anisotropic having a high velocity along one axis and a lower velocity along an orthogonal axis.

3. An acoustically quiet coil structure as claimed in claim 2 in which the transmissive material is cellular.

4. An acoustically quiet coil structure as claimed in claim 1 in which the plate comprises a multi-layer plastic composite structure.

5. An acoustically quiet coil structure as claimed in claim 4 in which all layers of the multi-layer plastic composite structure are woven glass fibre fabric reinforced plastics.

6. An acoustically quiet coil structure as claimed in claim 4 in which all layers of the multi-layer plastic composite structure are woven carbon fibre fabric reinforced plastics.

7. An acoustically quiet coil structure as claimed in claim 4 in which the warp and weft threads are different materials with different wave propagation constants.

8. An acoustically quiet coil structure as claimed in claim 7 in which the warp material is glass fibre and the weft material is carbon fibre.

9. An acoustically quiet coil structure as claimed in claim 5 in which a plurality of the layers forms a lamination and in which the plate is formed from a set of laminations, each lamination having a different wave propagation constant k.

10. An acoustically quiet coil structure as claimed in claim 1 in which said chamfer comprises a single chisel edge chamfer.

11. An acoustically quiet coil structure as claimed in claim 1 in which said chamfer comprises a double edge chamfer.

12. An acoustically quiet coil structure as claimed in claim 1 in which said chamfer comprises a tulip shaped chamfer.

13. An acoustically quiet coil structure as claimed in claim 1 in which said chamfer comprises a cusp shaped chamfer.

14. An acoustically quiet coil structure as claimed in claim 10 in which the chamfer angle $\epsilon$ is determined such that an acoustic wave within said plate is reflected n times before normal internal reflection subject to the expression $n\epsilon=90°$.

15. An acoustically quiet coil structure as claimed in claim 3 in which the chamfer angle $\epsilon$ for both chamfer edges is determined such that the number of internal reflections n, before normal internal reflection, are subject to the expression $2/(n=1)\epsilon=90°$.

16. An acoustically quiet coil structure as claimed in claim 14 in which n is greater than 5.

17. An acoustically quiet coil as claimed in claim 1 in which one or more blocks of acoustically absorbent material are applied to one or more of said chamfered edges.

18. An acoustically quiet coil structure as claimed in claim 1 in which said plate comprises a first relatively low density material joined at an outer edge to a second relatively high density material, said relatively high density material being formed into an acoustic cavity, said acoustic cavity comprising a plurality of chamfered surfaces.

19. An acoustically quiet coil structure as claimed in claim 18 in which said acoustic cavity comprises a generally circular cross-section cavity formed from said high density material.

20. An acoustically quiet coil structure as claimed in claim 11 in which said double chamfer is modified at its narrower end to form a prismatic cavity, said prismatic cavity providing, in combination with said chamfer, a plurality of acoustically reflective surfaces.

21. An acoustically quiet coil structure as claimed in claim 11 in which said double chamfer is modified at its narrower end to form a semi-circular cavity, said semi circular cavity providing in combination with said chamfer a plurality of acoustically reflective surfaces.

22. An acoustically quiet coil structure as claimed in claim 1 including a plurality of chamfers forming a first multiple chisel shaped arrangement.

23. An acoustically quiet coil structure as claimed in claim 22 comprising a further plate, said further plate comprising a second plurality of chamfers forming a second multiple chisel shaped arrangement, said further plate being positioned close to said plate such that the first and second multiple chisel shaped arrangements interlock.

24. An acoustically quiet coil structure as claimed in claim 23 in which at least one of said electrical conductors is embedded in a capping strip attached to said plate of acoustically transmissive material, said capping strip being attached to said chamfered portion of said plate, said capping strip being formed from a material of lower acoustic velocity than said plate material.

25. An acoustically quiet coil structure as claimed in claim 24 in which said capping strip is provided with one or more chamfered edges.

26. An acoustically quiet coil structure as claimed in claim 1 in which said coil is cooled.

27. An acoustically quiet coil structure as claimed in claim 1 in which said coil is a gradient coil.

28. An acoustically quiet coil structure as claimed in claim 1 in which the coil structure is formed from a cylindrically shaped supporting material, the surface of which carries sets of serrations, grooves or notches running along the cylindrical axis.

29. An acoustically quiet coil structure according to claim 1 in which the coil structure is formed from a cylindrically shaped supporting material, the surface of which carries sets of serrations, grooves or notches running circumferentially around the surface.

30. An acoustically quiet coil structure as claimed in claim 1 in which the plate is mounted on an anti-vibration mount.

31. An acoustically quiet coil structure as claimed in claim 1 in which said plate comprises a composite cellular structure of cellular materials having positive and negative values of Poisson's ratio, $\sigma$, such that the overall $\sigma$ is substantially zero.

32. An acoustically quiet coil structure as claimed in claim 31 in which the positive and negative value materials comprise hexagonal and inverted hexagonal tubular structures.

33. An acoustically quiet coil structure as claimed in claim 1 in which one or more conductors comprises a first current carrying conductor to produce a magnetic field and a second current carrying conductor to produce acoustic cancellation.

34. An acoustically quiet coil structure as claimed in claim 33 in which both conductors are embedded in the plate in a closely spaced parallel configuration.

35. An acoustically quiet coil structure as claimed in claim 33 in which both conductors are embedded in the plate in a closely spaced coaxial configuration.

36. An acoustically quiet coil structure as claimed in claim 34 in which a return electrical current path for the second conductor lies outside the plate and is mounted on an anti-vibration plate.

37. An acoustically quiet coil structure for a magnetic resonance imaging system, sail coil comprising one or more conductors embedded in a plate of material, said plate comprising a composite cellular structure of cellular materials having positive and negative Poisson's ratio $\sigma$ such that the overall $\sigma$ is substantially zero.

38. An acoustically quiet coil structure as claimed in claim 37 in which the positive and negative value materials comprise hexagonal or circular and inverted hexagonal or inverted circular tubular structures.

* * * * *